United States Patent
Fujii et al.

(10) Patent No.: US 10,938,181 B2
(45) Date of Patent: Mar. 2, 2021

(54) VERTICAL CAVITY SURFACE EMITTING LASER AND METHOD FOR MANUFACTURING VERTICAL CAVITY SURFACE EMITTING LASER

(71) Applicant: SUMITOMO ELECTRIC INDUSTRIES, LTD., Osaka (JP)

(72) Inventors: Kei Fujii, Osaka (JP); Takamichi Sumitomo, Osaka (JP); Suguru Arikata, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/555,599

(22) Filed: Aug. 29, 2019

(65) Prior Publication Data
US 2020/0076161 A1 Mar. 5, 2020

(30) Foreign Application Priority Data
Aug. 31, 2018 (JP) .............................. JP2018-163390

(51) Int. Cl.
| | |
|---|---|
| *H01S 5/00* | (2006.01) |
| *H01S 5/22* | (2006.01) |
| *H01S 5/183* | (2006.01) |
| *H01S 5/343* | (2006.01) |
| *H01S 5/125* | (2006.01) |

(Continued)

(52) U.S. Cl.
CPC ............ *H01S 5/2226* (2013.01); *H01S 5/125* (2013.01); *H01S 5/183* (2013.01); *H01S 5/187* (2013.01); *H01S 5/18311* (2013.01); *H01S 5/18358* (2013.01); *H01S 5/3072* (2013.01); *H01S 5/343* (2013.01); *H01S 5/2206* (2013.01); *H01S 5/34313* (2013.01); *H01S 5/34353* (2013.01)

(58) Field of Classification Search
CPC ........ H01S 5/183; H01S 5/343; H01S 5/2206; H01S 5/18311; H01S 5/18358; H01S 5/187; H01S 5/34313; H01S 5/34353; H01S 5/2226; H01S 5/3072
See application file for complete search history.

(56) References Cited

U.S. PATENT DOCUMENTS

| | | | | |
|---|---|---|---|---|
| 2005/0147143 | A1* | 7/2005 | Jikutani | ................... H01S 5/423 372/43.01 |
| 2010/0020835 | A1* | 1/2010 | Anan | ................... H01S 5/18308 372/45.01 |

(Continued)

FOREIGN PATENT DOCUMENTS

JP 2008-108964 5/2008

*Primary Examiner* — Kinam Park
(74) *Attorney, Agent, or Firm* — Smith, Gambrell & Russell, LLP.

(57) ABSTRACT

A vertical cavity surface emitting laser includes: an active layer including a quantum well structure including one or more well layers including a III-V compound semiconductor containing indium as a group III constituent element; an upper laminated region containing a carbon dopant; and a substrate for mounting a post including the active layer and the upper laminated region, in which the active layer is provided between the upper laminated region and the substrate, the quantum well structure has a carbon concentration of $2 \times 10^{16}$ $cm^{-3}$ or less, and the upper laminated region includes a pile-up layer of indium at a position away from the active layer.

6 Claims, 7 Drawing Sheets

(51) Int. Cl.
 *H01S 5/187* (2006.01)
 *H01S 5/30* (2006.01)

(56) References Cited

U.S. PATENT DOCUMENTS

2016/0043529 A1* 2/2016 Koyama ............... H01S 5/1032
 372/28
2016/0099549 A1* 4/2016 Jogan .................... H01S 5/2027
 372/45.01

* cited by examiner

VERTICAL CAVITY SURFACE EMITTING LASER AND METHOD FOR MANUFACTURING VERTICAL CAVITY SURFACE EMITTING LASER

CROSS REFERENCE TO RELATED APPLICATIONS

The present application is based upon and claims the benefit of the priority from Japanese patent application No. 2018-163390, filed on Aug. 31, 2018, which is hereby incorporated by reference in its entirety.

TECHNICAL FIELD

The present disclosure relates to a vertical cavity surface emitting laser and a method for manufacturing a vertical cavity surface emitting laser.

BACKGROUND

Japanese Unexamined Patent Application Publication No. 2008-108964 discloses a light-emitting diode.

SUMMARY

The present disclosure provides a vertical cavity surface emitting laser comprising: an active layer comprising a quantum well structure comprising one or more well layers including a III-V compound semiconductor containing indium as a group III constituent element; an upper laminated region containing a carbon dopant; and a substrate for mounting a post including the active layer and the upper laminated region, in which the active layer is provided between the upper laminated region and the substrate, the quantum well structure has a carbon concentration of $2 \times 10^{16}$ cm$^{-3}$ or less, and the upper laminated region includes a pile-up layer of indium at a position away from the active layer.

The present disclosure provides a method for manufacturing a vertical cavity surface emitting laser comprising: (a) disposing a substrate including a III-V compound semiconductor containing Ga and As as constituent elements in a growth furnace; (b) growing a first semiconductor by supplying a group III source material and a group V source material to the growth furnace; (c) interrupting a growth of a semiconductor without supplying the group III source material to the growth furnace after growing the first semiconductor; and (d) growing a second semiconductor by supplying a carbon dopant, a group III source material and a group V source material to the growth furnace after interrupting the growth of the semiconductor, in which growing the first semiconductor comprises growing an active layer having a first compound semiconductor layer containing indium from the group III source material as a group III element on the substrate, and growing the second semiconductor comprises forming an upper semiconductor laminate having a second compound semiconductor layer containing the carbon dopant on the substrate.

BRIEF DESCRIPTION OF THE DRAWINGS

The foregoing and other purposes, aspects and advantages will be better understood from the following detailed description of a preferred embodiment of the invention with reference to the attached drawings.

DETAILED DESCRIPTION

Figure 1:
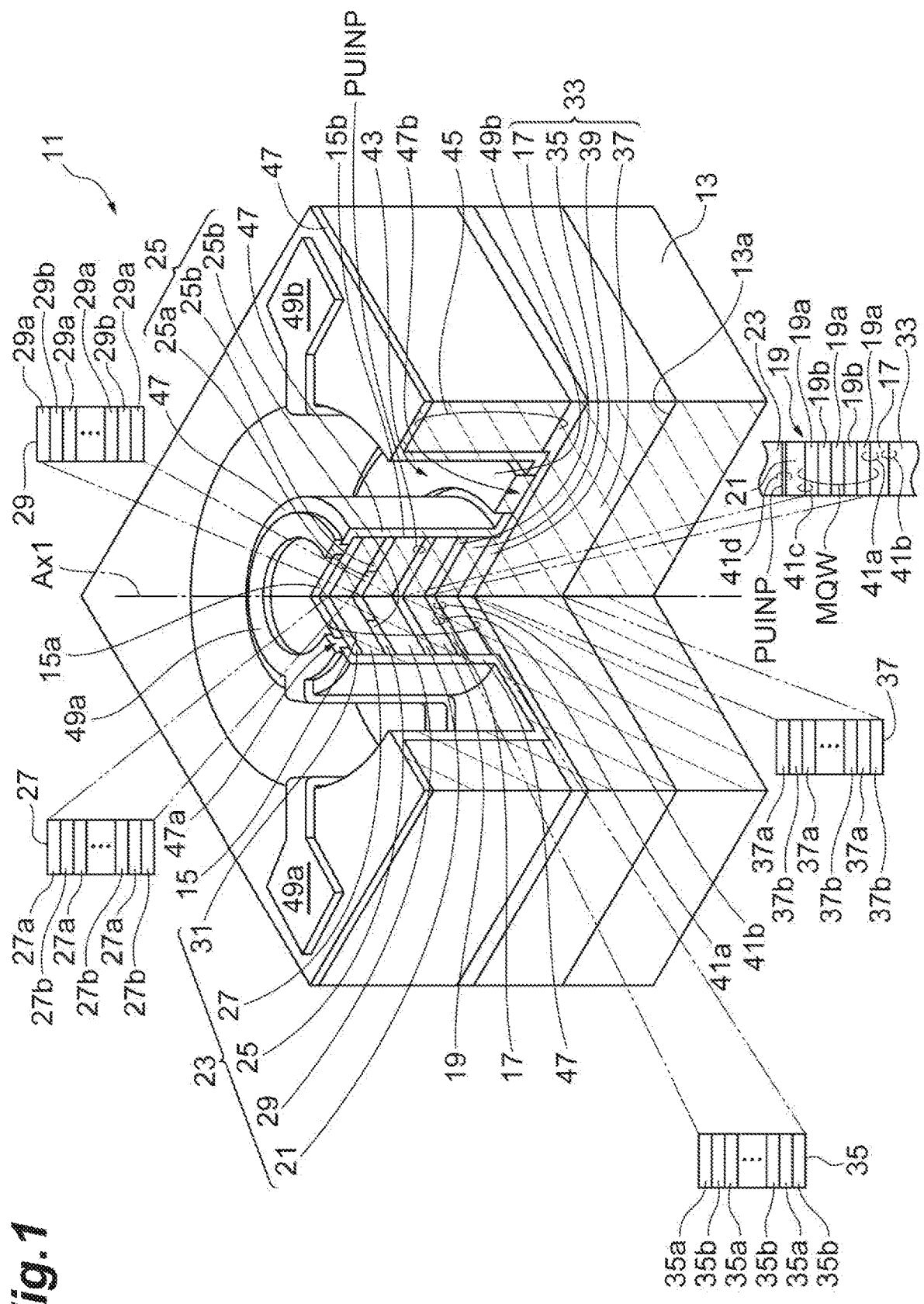
FIG. 1 is a partially cutaway view showing a vertical cavity surface emitting laser according to the present embodiment.

Problem to be Solved by the Present Disclosure

The light-emitting diode of Patent literature 1 includes a lower cladding layer of $(Al_{0.7}Ga_{0.3})_{0.5}In_{0.5}P$; an active layer having a multiquantum well structure including a well layer of $(Al_{0.2}Ga_{0.8})_{0.5}In_{0.5}P$ and a barrier layer of $(Al_{0.5}Ga_{0.5})_{0.5}In_{0.5}P$, or a bulk active layer of $(Al_{0.2}Ga_{0.8})_{0.5}In_{0.5}P$; an upper clad layer of $(Al_{0.7}Ga_{0.3})_{0.5}In_{0.5}P$; and a GaP current diffusion layer.

Advantageous Effect of the Present Disclosure

According to the present disclosure, a vertical cavity surface emitting laser having an active layer with a low carbon concentration can be provided. According to the present disclosure, a method for manufacturing a vertical cavity surface emitting laser capable of providing a low carbon concentration to an active layer can be provided.

Description of Embodiments of the Present Disclosure

Several specific examples will be described.

A vertical cavity surface emitting laser according to a specific example includes: (a) an active layer comprising a quantum well structure comprising one or more well layers including a III-V compound semiconductor containing indium as a group III constituent element; (b) an upper laminated region containing a carbon dopant; and (c) a substrate for mounting a post including the active layer and the upper laminated region, in which the active layer is provided between the upper laminated region and the substrate, the quantum well structure has a carbon concentration of $2\times10^{16}$ cm$^{-3}$ or less, and the upper laminated region includes a pile-up layer of indium at a position away from the active layer.

According to the vertical cavity surface emitting laser, the pile-up layer of indium is provided at a position away from the active layer in the upper laminated region. The pile-up layer can provide the vertical cavity surface emitting laser with a structure that reduces carbon dopants that diffuse into the active layer during manufacture from an upper laminated region containing a carbon dopant.

The vertical cavity surface emitting laser according to a specific example further includes a lower laminated region provided on the substrate. The lower laminated region includes a lower laminate for a distributed Bragg reflector and a lower spacer layer provided between the lower laminate and the active layer. The lower laminated region includes a III-V compound semiconductor containing at least one of aluminum and gallium but not containing indium as a group III element. The upper laminated region includes an upper laminate for a distributed Bragg reflector and an upper spacer layer disposed between the upper laminate and the active layer.

According to the vertical cavity surface emitting laser, the upper laminated region may have a pile-up layer of indium in a region including an interface between the upper laminate and the upper spacer layer.

In a vertical cavity surface emitting laser according to a specific example, the quantum well structure includes an AlGaInAs well layer and an AlGaAs barrier layer.

According to the vertical cavity surface emitting laser, excellent light emission characteristics can be obtained in the active layer including the AlGaInAs well layer and the AlGaAs barrier layer.

A method for manufacturing a vertical cavity surface emitting laser according to a specific example includes: (a) disposing a substrate including a III-V compound semiconductor containing Ga and As as constituent elements in a growth furnace; (b) growing a first semiconductor by supplying a group III source material and a group V source material to the growth furnace; (c) interrupting a growth of a semiconductor without supplying the group III source material to the growth furnace after growing the first semiconductor; and (d) growing a second semiconductor by supplying a carbon dopant, a group III source material and a group V source material to the growth furnace after interrupting the growth of the semiconductor, in which growing the first semiconductor comprises growing an active layer having a first compound semiconductor layer containing indium from the group III source material as a group III element on the substrate, and growing the second semiconductor comprises forming an upper semiconductor laminate having a second compound semiconductor layer containing the carbon dopant on the substrate.

According to the method for manufacturing a vertical cavity surface emitting laser, the method makes the first compound semiconductor layer containing indium from the group III source material of the source gas (group III source material and group V source material) supplied to the growth furnace as a group III element grow on the substrate, supplies the group V source material to the growth furnace, and interrupts the growth of the semiconductor without supplying the group III source material to the growth furnace. Due to the growth interruption, the semiconductor surface is modified. An upper semiconductor laminate is formed on a surface modified in a growth furnace. In the modification, indium atoms are incorporated into the semiconductor surface as a group III constituent element.

In a method for manufacturing a vertical cavity surface emitting laser according to a specific example, the first semiconductor is grown at a first substrate temperature, the second semiconductor is grown at a second substrate temperature, the second substrate temperature is higher than the first substrate temperature, and the interrupting the growth of the semiconductor comprises changing a temperature from the first substrate temperature to the second substrate temperature.

According to the method for manufacturing a vertical cavity surface emitting laser, a substrate temperature may be changed at the time of the growth interruption.

In a method for manufacturing a vertical cavity surface emitting laser according to a specific example, the active layer has a carbon concentration of $2\times10^{16}$ cm$^{-3}$ or less.

According to the method for manufacturing a vertical cavity surface emitting laser, the method can form a pile-up layer of indium on a semiconductor surface at the time of modification during growth interruption. The pile-up layer can reduce the diffusion of the carbon supplied in the subsequent growth to the active layer.

Detailed Description of the Embodiments of the Present Disclosure

The findings of the invention can be readily understood by considering the following detailed description, with reference to the accompanying drawings, which are given by way of illustration. Next, with reference to the accompanying drawings, embodiments of the invention relating to a vertical cavity surface emitting laser and a method for manufacturing a vertical cavity surface emitting laser will be described. If possible, the same parts are denoted by the same reference numerals.

FIG. 1 is a partially cutaway view showing a vertical cavity surface emitting laser according to the present embodiment. A vertical cavity surface emitting laser 11 includes a substrate 13, an active layer 19, and an upper laminated region 23. A post 15 is mounted on the substrate 13. The post 15 includes an active layer 19 and an upper laminated region 23. The active layer 19 is provided between the upper laminated region 23 and the substrate 13. The upper laminated region 23 contains a carbon dopant. The active layer 19 has a quantum well structure MQW, and the quantum well structure MQW has one or more well layers 19a. The well layer 19a includes a III-V compound semiconductor containing indium as a group III constituent element. The quantum well structure MQW has a carbon concentration of less than or equal to $2\times10^{16}$ cm$^{-3}$. The upper laminated region 23 includes indium deposits, specifically a pile-up layer, at a position away from the active layer 19.

According to the vertical cavity surface emitting laser 11, a pile-up layer PUINP of indium is provided at a position away from the active layer 19 in the upper laminated region 23. The pile-up layer PUINP can provide a vertical cavity surface emitting laser 11 with a structure that reduces carbon dopants that diffuse into the active layer 19 during manufacture from the upper laminated region 23 containing carbon dopants.

The vertical cavity surface emitting laser 11 further includes a lower laminated region 33 in addition to the upper laminated region 23. The active layer 19 is provided between the upper laminated region 23 and the lower laminated region 33. The upper laminated region 23 includes an upper laminates (25, 27, 29) for a distributed Bragg reflector and an upper spacer layer 21. The upper spacer layer 21 is provided between the upper laminates (25, 27, 29) and the active layer 19. According to the vertical cavity surface emitting laser 11, the upper laminated region 23 may have a pile-up layer PUINP of indium in a region including an interface between the upper laminates (25, 27, 29) and the upper spacer layer 21.

The substrate 13 has a main surface 13a. The main surface 13a includes a III-V compound semiconductor containing Ga and As as constituent elements. The vertical cavity surface emitting laser 11 includes a post 15 provided on the main surface 13a of the substrate 13. The substrate 13 and the posts 15 are arrayed in the direction of the first axis Ax1. The post 15 includes an upper surface 15a and a side surface 15b. Referring to FIG. 1, the post 15 is depicted as having a cylindrical shape, but the shape of the post 15 is not limited thereto.

In the vertical cavity surface emitting laser 11, the post 15 may further include an active layer 19 and an upper spacer layer 21. The upper spacer layer 21 includes a III-V compound semiconductor containing Ga and As as constituent elements. The upper spacer layer 21 may include a III-V compound semiconductor containing Ga and Al as group III elements and As as a group V element such as AlGaAs.

The post 15 includes a lower spacer layer 17. The lower spacer layer 17 includes a III-V compound semiconductor containing Ga and As as constituent elements. The lower spacer layer 17 may include a III-V compound semiconductor containing Ga and Al as group III elements and As as a group V element such as AlGaAs.

The quantum well structure MQW of the active layer 19 includes one or more barrier layers 19b in addition to the well layer 19a. In the quantum well structure MQW, the well layers 19a and the barrier layers 19b are alternately arrayed in the direction of the first axis Ax1. The well layer 19a includes a III-V compound semiconductor containing indium (In) as a group III element. The III-V compound semiconductor may include a III-V compound semiconductor containing aluminum (Al) and gallium (Ga) as group III elements. The barrier layer 19b includes a III-V compound semiconductor containing aluminum (Al) and gallium (Ga) as group III elements. Each III-V compound semiconductor of the well layer 19a and the barrier layer 19b does not contain nitrogen (N) as a group V element, and may contain arsenic (As) as a group V element. The semiconductor of the active layer 19 has a zinc blende crystal structure.

The quantum well structure MQW may include, for example, an AlGaInAs well layer and an AlGaAs barrier layer. According to the vertical cavity surface emitting laser 11, it is possible to provide a low carbon concentration in the quantum well structure MQW, thereby providing good light emission characteristics.

The active layer 19 is provided on the lower spacer layer 17. The upper spacer layer 21 is provided on the active layer 19. Each of the lower spacer layer 17 and the upper spacer layer 21 has a band gap that is larger than the band gap of the well layer 19a.

The active layer 19 is provided between the upper laminated region 23 and the lower laminated region 33, and is located between the lower spacer layer 17 and the upper spacer layer 21. In the present example, the substrate 13, the lower laminated region 33, the active layer 19, and the upper laminated region 23 are arrayed in the direction of the first axis Ax1.

In the present example, the lower spacer layer 17 makes contact with the lowermost well layer 19a in the active layer 19 to form a first interface 41a. The lower laminated region 33 makes contact with the lower spacer layer 17 to form a second interface 41b.

In the present example, the upper spacer layer 21 makes contact with the uppermost well layer 19a in the active layer 19 to form a third interface 41c. The upper spacer layer 21 makes contact with the second upper laminate 29 to form a fourth interface 41d.

The lower laminated region 33 is provided on the substrate 13. The lower laminated region 33 includes a lower laminates (35, 37, 39) for a distributed Bragg reflector and the lower spacer layer 17. The lower spacer layer 17 is provided between the lower laminates (35, 37, 39) and the active layer 19. The lower laminated region 33 includes a III-V compound semiconductor containing at least one of aluminum and gallium but not containing indium as a group III element.

The active layer 19 may have a carbon concentration of less than or equal to $2 \times 10^{16}$ cm$^{-3}$. The carbon concentration of the active layer 19 may be measured by, for example, a second ion mass spectrometry (SIMS) method, and may be an average value over the entire active layer 19.

The upper laminated region 23 may include the current confinement structure 25. The current confinement structure 25 includes a conductive region 25a of a group III-V semiconductor containing Al and an insulating region 25b of an oxide containing a constituent element of the group III-V semiconductor. Specifically, the upper laminated region 23 may include the upper spacer layer 21, the first upper laminate 27 and the second upper laminate 29 for the upper distributed Bragg reflector and the current confinement structure 25, and may include an upper contact layer 31 that provides upper surface of an upper laminated region 23, if necessary.

In the present example, the post 15 includes a portion of the lower laminated region 33 disposed between the lower spacer layer 17 and the substrate 13, specifically a first lower laminate 35 forming part of a lower distributed Bragg reflector. The lower laminated region 33 may further include the second lower laminate 37 in addition to the first lower laminate 35, and may include the lower contact layer 39, if necessary. The lower contact layer 39 is positioned between the first lower laminate 35 and the second lower laminate 37.

In the present example, the vertical cavity surface emitting laser 11 includes a groove 43 and a terrace 45. The groove 43 separates the post 15 from the terrace 45 to define the post 15. The terrace 45 has substantially the same semiconductor laminated structure as the posts 15. The post 15 includes an upper portion of the lower contact layer 39, and a lower portion is provided on a main surface of the substrate 13 outside the post 15. A lower portion of the lower contact layer 39 defines a bottom surface of the groove 43.

The vertical cavity surface emitting laser 11 further includes a protective film 47 covering the surface of the post 15, the groove 43 and the terrace 45. The protective film 47 includes a silicon-based inorganic insulating film such as SiON or SiN, for example. The vertical cavity surface emitting laser 11 includes an upper electrode 49a and a lower electrode 49b. The protective film 47 includes a first opening 47a and a second opening 47b. In the present example, the first opening 47a is located, for example, on the upper surface of the post 15. The second opening 47b is positioned, for example, on the bottom surface of the groove 43. The upper electrode 49a and the lower electrode 49b makes contact with the upper contact layer 31 and the lower contact layer 39 via the first opening 47a and the second opening 47b, respectively.

In the present example, the upper laminated region 23 includes the first upper laminate 27 and the second upper laminate 29 for the upper distributed Bragg reflector. Specifically, the first upper laminate 27 includes a first upper layer 27a and a second upper layer 27b that are alternately arrayed to allow distributed Bragg reflection. The refractive indices of the first upper layer 27a and the second upper layer 27b are different from each other. The difference in refractive index is due to a difference of the aluminum composition between the first upper layer 27a and the second upper layer 27b, for example.

Each of the first upper layers 27a of the first upper laminate 27 includes a first semiconductor region containing Al and Ga as group III elements and a first insulator region surrounding the first semiconductor region. The first insulator region is composed of an oxide of a constituent element of the first semiconductor region. This oxide extends from the side surface 15b of the post 15 toward the inside of the post 15 to reach the first semiconductor region. The second upper layer 27b of the first upper laminate 27 includes a second semiconductor region containing Al and Ga as group III elements and a second insulator region surrounding the second semiconductor region. The second insulator region is composed of an oxide of a constituent element of the second semiconductor region. This oxide extends from the side surface 15b of the post 15 toward the inside of the post 15 to reach the second semiconductor region. The depth of the oxide reaching the first semiconductor region and the depth of the oxide reaching the second semiconductor region are related to the Al composition of the first semiconductor region and the second semiconductor region. In the present example, the Al composition of the first semiconductor region is larger than the Al composition of the second semiconductor region.

The second upper laminate 29 includes a first upper layer 29a and a second upper layer 29b which are alternately arrayed to allow distributed Bragg reflection. The refractive indices of the first upper layer 29a and the second upper layer 29b are different from each other. The difference in refractive index is due to a difference of the aluminum composition between the first upper layer 29a and the second upper layer 29b, for example.

Each of the first upper layers 29a of the second upper laminate 29 includes a first semiconductor region containing Al and Ga as group III elements and a first insulator region surrounding the first semiconductor region. The first insulator region is composed of an oxide of a constituent element of the first semiconductor region. This oxide extends from the side surface 15b of the post 15 toward the inside of the post 15 to reach the first semiconductor region. The second upper layer 29b of the second upper laminate 29 includes a second semiconductor region containing Al and Ga as group III elements and a second insulator region surrounding the second semiconductor region.

The second insulator region is composed of an oxide of a constituent element of the second semiconductor region. This oxide extends from the side surface 15b of the post 15 toward the inside of the post 15 to reach the second semiconductor region. The depth of the oxide reaching the first semiconductor region and the depth of the oxide reaching the second semiconductor region are related to the Al composition of the first semiconductor region and the second semiconductor region. In the present example, the Al composition of the first semiconductor region is larger than the Al composition of the second semiconductor region.

The conductive region 25a of the current confinement structure 25 has an Al composition larger than the Al composition of the first semiconductor region of the first upper layer 27a and the Al composition of the first semiconductor region of the first upper layer 29a.

In the present example, the lower laminated region 33 includes the first lower laminate 35 and the second lower laminate 37 for the lower distributed Bragg reflector. Specifically, the first lower laminate 35 includes a first lower layer 35a and a second lower layer 35b that are alternately arrayed to allow distributed Bragg reflection. The refractive indices of the first lower layer 35a and the second lower layer 35b are different from each other. The difference in refractive index is due to a difference of the aluminum composition between the first lower layer 35a and the second lower layer 35b, for example.

Each of the first lower layers 35a of the first lower laminate 35 includes a first semiconductor region containing Al and Ga as group III elements, and further includes the first insulator region surrounding the first semiconductor region if possible. The first insulator region is composed of an oxide of the constituent element of the first semiconductor region. This oxide extends from the side surface 15b of the post 15 toward the inside of the post 15 to reach the first semiconductor region. The second lower layer 35b of the first lower laminate 35 includes the second semiconductor region containing Al and Ga as group III elements, and if possible, further includes the second insulator region surrounding the second semiconductor region. The second insulator region is composed of an oxide of a constituent element of the second semiconductor region. This oxide extends from the side surface 15b of the post 15 toward the inside of the post 15 to reach the second semiconductor region. The depth of the oxide reaching the first semiconductor region and the depth of the oxide reaching the second semiconductor region are related to the Al composition of the first semiconductor region and the second semiconductor region. In the present example, the Al composition of the first semiconductor region is larger than the Al composition of the second semiconductor region.

The second lower laminate 37 includes a first lower layer 37a and a second lower layer 37b which are alternately arrayed to allow distributed Bragg reflection. The refractive indices of the first lower layer 37a and the second lower layer 37b are different from each other. The difference in the refractive index is due to a difference of the aluminum composition between the first lower layer 37a and the second lower layer 37b. Each of the first lower layers 37a of the second lower laminate 37 includes a first semiconductor region including Al and Ga as group III elements. The second lower layer 37b of the second lower laminate 37 includes a second semiconductor region containing Al and Ga as group III elements. In the present example, the Al composition of the first semiconductor region is larger than the Al composition of the second semiconductor region.

A specific example of the vertical cavity surface emitting laser 11

Substrate 13: Off-GaAs substrate with fine inclination
The main surface 13a of the substrate 13 is inclined in the <110> direction with reference to the (001) plane of GaAs.
The first lower laminate 35 and the second lower laminate 37 of a lower laminated region 33.

First lower layer 37a/second lower layer 37b: alternating lamination of undoped Al (x)Ga(1−x)As/Al(y)Ga(1−y)As (composition: 0.8<x≤1 0.1≤y<0.3).

Lower contact layer 39: Si-doped n-type AlGaAs.

First lower layer 35a/second lower layer 35b: alternating lamination of Si doped Al(x)Ga(1−x)As/Al(y)Ga(1−y)As (composition: 0.8<x≤1 0.1≤y<0.3).

The lamination number of the first lower laminate 35 and the second lower laminate 37: 25 cycles in total.

Lower spacer layer 17: Al(z)Ga(1−z)As layer (0.1<z<0.4) grown as undoped, thickness 5 to 25 nm.

Quantum well structure MQW of the active layer 19.

Well layer 19a/Barrier layer 19b: undoped AlGaInAs well layer/AlGaAs barrier layer.

Well layer 19a: Al composition 0.01 to 0.08, In composition 0.08 to 0.18, and film thickness 2 to 7 nm.

Barrier layer 19b: Al composition 0.1 to 0.4, and film thickness 5 to 9 nm.

A carbon concentration in the active layer 19 of less than or equal to $2 \times 10^{16}$ cm$^{-3}$ can provide good quality. The carbon concentration of the active layer 19 is measured by the analysis in the depth direction by the secondary ion mass spectrometry (SIMS) method. The carbon concentration averages the carbon concentration profile of SIMS across the active layer 19.

Upper spacer layer 21: Al(z)Ga(1−z)As layer grown as undoped (composition: 0.1<z<0.4), thickness 5 to 25 nm.

Current confinement structure 25.

Conductive region 25a: AlAs or AlGaAs(Al composition of 0.98).

Insulating region 25b: aluminum oxide, gallium oxide.

A first upper laminate 27 and a second upper laminate 29 of the upper laminated region 23.

Carbon dopant concentration: $5 \times 10^{17}$ to $5 \times 10^{19}$ cm$^{-3}$.

First upper layer 27a/second upper layer 27b: the alternating lamination of C doped Al (u)Ga(1−u)As/C doped Al (v)Ga(1−v)As (composition: 0.8<u≤1 0.1≤v<0.3).

First upper layer 29a/second upper layer 29b: the alternating lamination of C doped Al (u)Ga(1−u)As/C doped Al (v)Ga(1−v)As (composition: 0.8<u≤1 0.1≤v<0.3).

The lamination number of the first upper laminate 27 and the second
upper laminate 29: 23 cycles in total.

Upper contact layer 31: C doped p-type AlGaAs.

P-electrode (49a): Ti/Pt.

N electrode (49b): For example Au/Ge/Ni.

Figure 2:
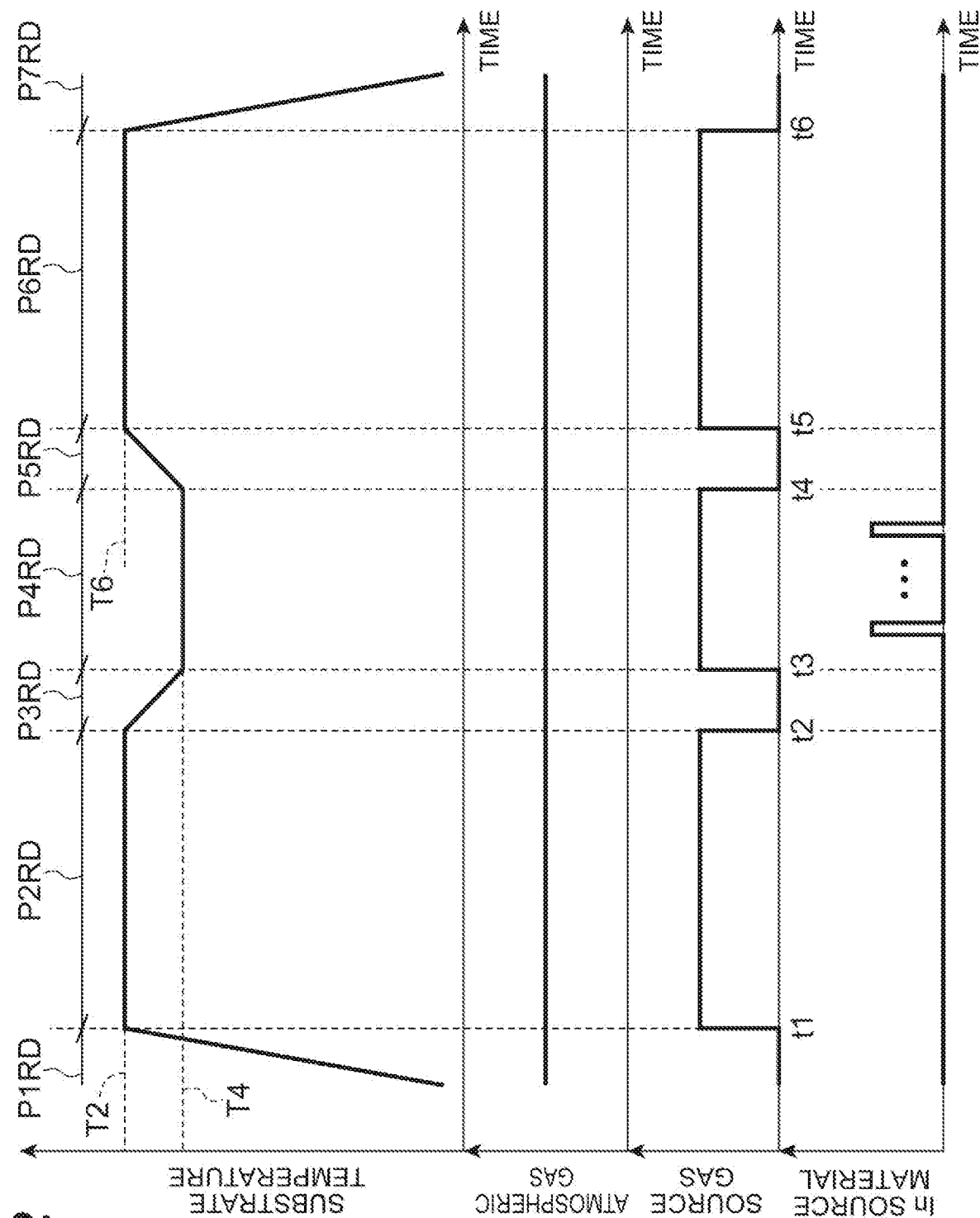
FIG. 2 is a diagram showing a temperature profile and a gas switching sequence in epitaxial growth.

Referring to FIGS. 2, 3A, 3B, 4A, 4B, 5A, 5B, 6A and 6B, a method for manufacturing a vertical cavity surface emitting laser will be described. FIG. 2 is a diagram showing a temperature profile and a gas switching sequence in epitaxial growth. Each of FIGS. 3A, 3B, 4A, 4B, 5A, 5B, 6A and 6B is a schematic view showing a main step in a method for manufacturing a vertical cavity surface emitting laser according to the present embodiment.

Referring to FIG. 2, epitaxial growth includes periods of a temperature rise P1RD, a growth P2RD of the lower laminate, a growth interruption P3RD, a growth P4RD of an intermediate laminate (a spacer region and an active layer), a growth interruption P5RD, a growth P6RD of the upper laminate, and a temperature drop P7RD. For crystal growth, for example, the following materials can be used. The Al source material includes trimethylaluminum (TMAl). The Ga source material includes trimethylgallium (TMGa). The In source material includes trimethylindium (TMIn). The arsenic source material contains arsine (AsH$_3$). The dopant gas that imparts n-conductivity includes silane (SiH$_4$). The dopant gas that imparts p-conductivity includes carbon tetrabromide (CBr$_4$).

Figure 3A:
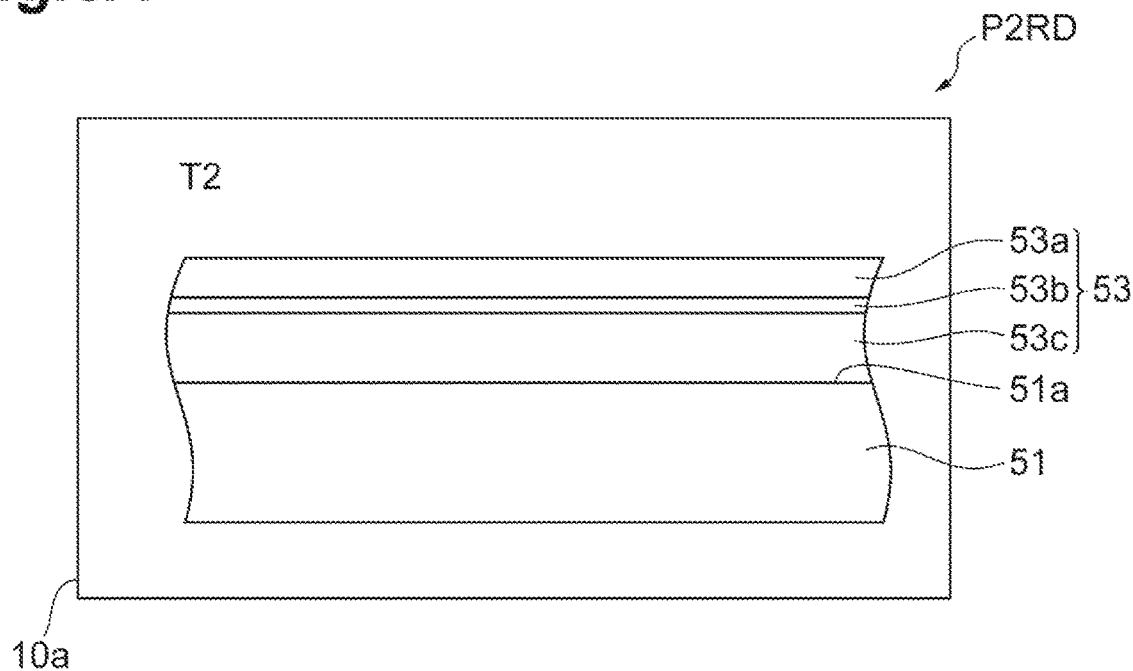
FIG. 3A is a view schematically showing a main step in a method for manufacturing a vertical cavity surface emitting laser according to the present embodiment.

A substrate 51 for growth, specifically a substrate 51 including a III-V compound semiconductor containing Ga and As as constituent elements, is prepared. As shown in FIG. 3A, the substrate 51 is placed in a growth furnace 10a. In the present example, a GaAs wafer, for example, is prepared as a substrate 51 for the growth. In the growth furnace 10a, metalorganic vapor phase epitaxy can be carried out.

As shown in FIG. 3A, in the period of temperature rise P1RD, the stage temperature (hereinafter referred to as "substrate temperature") of the growth furnace 10a is increased so as to reach the substrate temperature (T2) for the growth of a lower laminate 53. In the present example, the lower laminate 53 includes a semiconductor layer for the lower laminated region 33, specifically, a semiconductor layers (53a, 53b, 53c) for the first lower laminate 35, the lower contact layer 39 and the second lower laminate 37. After the substrate temperature reaches the target temperature, in the period of the growth P2RD of the lower laminate, gas is switched to start a supply of the deposition gas including the source material containing the metalorganic material to the growth furnace 10a at the time t1 and stop the deposition in the growth furnace 10a at the time t2 at which the lower laminate 53 can be completed.

The lower laminate 53 includes, for example, a GaAs layer and/or a semiconductor layer of AlGaAs.

Example of Growth Conditions.

Substrate temperature for semiconductor crystal growth: 670 to 750 degrees Celsius.

Supply ratio between the group V source material and the group III source material: V/III ratio=100 to 160.

Indium source material is not supplied.

Growth rate: 0.4 to 0.7 nm/sec.

At the substrate temperature according to this, the lower laminate 53 including a semiconductor layer for a lower distributed Bragg reflector is grown on a main surface 51a of the substrate 51.

Figure 3B:
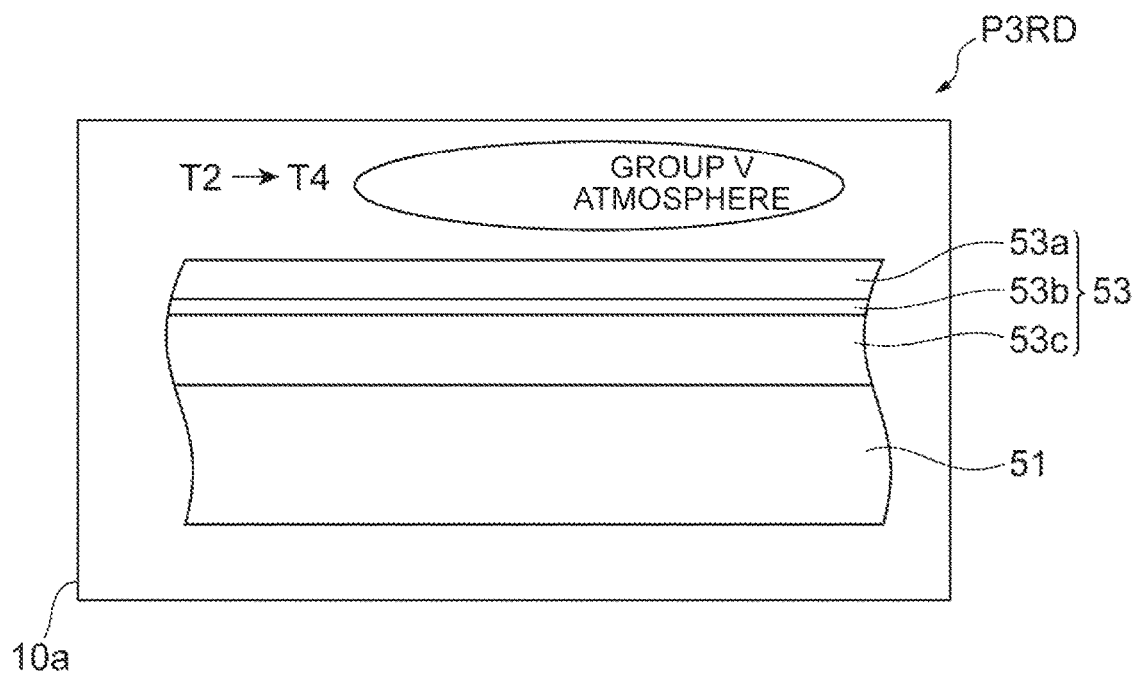
FIG. 3B is a view schematically showing a main step in a method for manufacturing a vertical cavity surface emitting laser according to the present embodiment.

As shown in FIG. 3B, in the period of the growth interruption P3RD (time t2 to t3), preparation for growing the intermediate laminate 57 on the lower laminate 53 is performed. In the present example, a substrate temperature is decreased from a growth temperature (T2) of 670 degrees Celsius or more, and a substrate temperature (T4) of 620 degrees Celsius or less is provided to the growth furnace 10a. In the growth interruption, arsenic source material (group V source material) is supplied to the growth furnace 10a without supplying the group III metalorganic source material to the growth furnace 10a to form an arsenic atmosphere.

Atmospheric gas: arsine of a group V source material.

Temperature change rate: 10 to 30 degrees/min.

Time for growth interruption: 3 to 20 min

During the period of the growth interruption P3RD, the surface of the lower laminate 53 (for example, Al(y)Ga (1−y)As (composition: 0.1≤y<0.3) is exposed to an arsenic atmosphere at a temperature lower than the growth temperature.

At a period (time t4 to t3) of the growth P4RD of the intermediate laminate (the spacer region and the active layer), at a target temperature reached by a drop in a substrate temperature, supplying a deposition gas containing a metalorganic source material to the growth furnace 10a is started at the time t3 to grow the intermediate laminate 57, and supplying the deposition gas to the growth furnace 10a is stopped at the time t4 to complete the growth of the intermediate laminate 57. The intermediate laminate 57 includes the upper spacer layer 21, the active layer 19 (the well layers 19a and the barrier layers 19b), and semiconductor layers (57a, 57b, 57c) for the lower spacer layer 17. The drop in temperature during the growth interruption P3RD period allows crystal growth at a low substrate temperature.

Figure 4A:
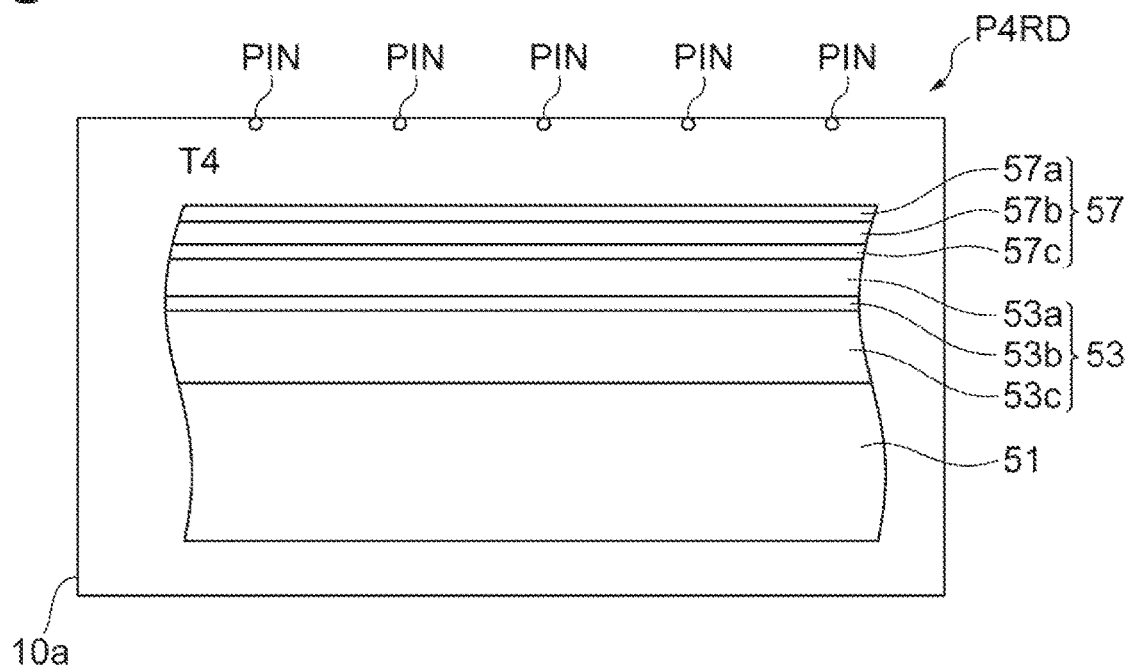
FIG. 4A is a view schematically showing a main step in a method for manufacturing a vertical cavity surface emitting laser according to the present embodiment.

Specifically, as shown in FIG. 4A, at the substrate temperature given as a result of the growth interruption, a source gas containing a metalorganic source material for growing the semiconductor layer (57c) for the lower spacer layer 17 is supplied to the growth furnace 10a, and an undoped AlGaAs layer is grown on the surface of the lower laminate 53. The low substrate temperature limits the migration of atoms as compared with the growth of the lower laminate 53. The semiconductor layer (57c) is a layer of undoped Al(z)Ga(1−z)As layer (composition: $0.1 < z < 0.4$) having a thickness of, for example, 5 to 25 nm.

Example of Growth Conditions of the semiconductor layer (57c).
Source materials used for growth: TMAl, TMGa, AsH$_3$, and dopants are not supplied.
Substrate temperature for growth: 570 to 620 degrees Celsius.
Supply ratio between the group V source material and the group III source material: V/III ratio=100 to 160.
Growth rate: 0.4 to 0.7 nm/sec.
The semiconductor layer (57c) forms an interface (41b) with the underlying lower laminate 53. The lower laminate 53 is exposed to an arsenic atmosphere at a temperature lower than the growth temperature during the growth interruption. In the present example, the semiconductor layer (57c) contains a carbon concentration of $2 \times 10^{16}$ cm$^{-3}$ or less over the entire area.

Without changing the substrate temperature, in the present example, growing a semiconductor fosourceell layer on the semiconductor layer (57c), growing a semiconductor for a barrier layer on a semiconductor layer fosourceell layer, and growing a semiconductor fosourceell layer on a semiconductor layer for a barrier layer are repeated, thereby growing a semiconductor laminate (57b) for the quantum well structure MQW of the active layer 19.

Example of Growth Conditions of the semiconductor laminate (57b).
Source materials used for growth: TMAl, TMGa, TMIn, AsH$_3$, and dopants are not supplied.
Substrate temperature for growth: 570 to 620 degrees Celsius.
Supply ratio between the group V source material and the group III source material: V/III ratio=100 to 160.
Growth rate: 0.4 to 0.7 nm/sec.
The semiconductor layer for the well layer 19a: Al composition 0.01 to 0.08, In composition 0.08 to 0.18, and film thickness 2 to 7 nm.
A semiconductor layer for the barrier layer 19b: Al composition 0.1 to 0.4, film thickness 5 to 9 nm.
The semiconductor laminate (57b) forms an interface with the underlying semiconductor layer (57c). In order to obtain a good emission intensity, the semiconductor laminate (57) may include a carbon concentration of less than or equal to $2 \times 10^{16}$ cm$^{-3}$ over the whole of the well layer and the barrier layer in the present example.

During growth of the well layer, an indium source material is supplied to the growth furnace 10a. Indium source material and indium from indium source material (referred to as an "indium deposit PIN") are deposited on the chamber wall of growth furnace 10a.

A source gas containing a metalorganic source material for growing the semiconductor layer (57a) for an upper spacer layer 21 is supplied to a growth furnace 10a without changing a substrate temperature, and an undoped AlGaAs layer is grown on a semiconductor laminate (57b). The low substrate temperature limits the migration of atoms as well as the growth of the semiconductor layer (57c). The semiconductor layer (57a) is an undoped Al(z)Ga(1−z)As ($0.1 < z < 0.4$) layer having a thickness of, for example, 5 to 25 nm.

Example of Growth Conditions of the semiconductor layer (57a).
Source materials used for growth: TMAl, TMGa, AsH$_3$, and dopants are not supplied.
Substrate temperature for growth: 570 to 620 degrees Celsius.
Supply ratio between the group V source material and the group III source material: V/III ratio=100 to 160.
Growth rate: 0.4 to 0.7 nm/sec.

As will be understood from the above description, a group III source material and a group V source material are supplied to the growth furnace 10a to grow a first semiconductor on the lower laminate 53 on the substrate 51. In growing the first semiconductor, a first compound semiconductor layer containing indium from a group III source material as a group III element is grown on the substrate 51.

Specifically, the growth of the intermediate laminate (the spacer region and the active layer) is provided by supplying a deposition gas containing a metalorganic source material to the growth furnace 10a to grow a first compound semiconductor layer not containing In as the group III element but containing Al as the group III element at a substrate temperature of 620 degrees Celsius or less, and supplying a deposition gas containing a metalorganic source material to the growth furnace 10a to grow the second compound semiconductor layer containing In as the group III element at a substrate temperature of 620 degrees Celsius or less.

After the first compound semiconductor layer is grown, the growth of the semiconductor is interrupted without supplying the group III source material to the growth furnace 10a.

Figure 4B:
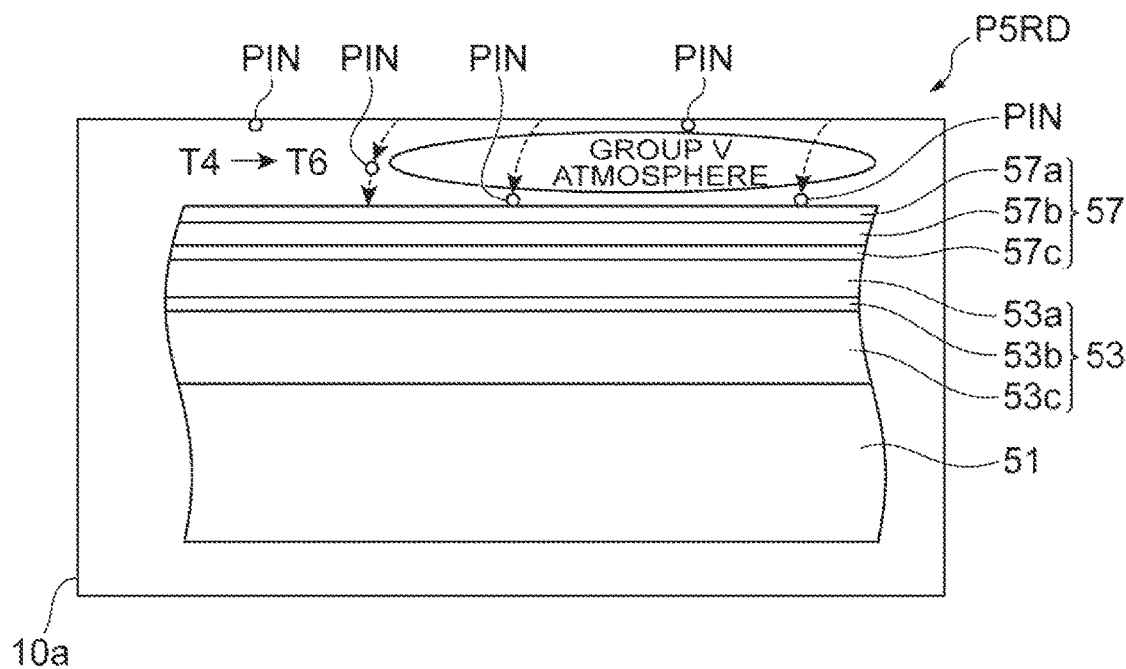
FIG. 4B is a view schematically showing a main step in a method for manufacturing a vertical cavity surface emitting laser according to the present embodiment.

Specifically, after the growth of the intermediate laminate 57 is completed at time t4, as shown in FIG. 4B, a preparation for growing an upper laminate 59 on the intermediate laminate 57 is performed during the period of the growth interruption P5RD. In the present example, the substrate temperature is increased from a growth temperature of 590 degrees Celsius or less, and a substrate temperature (T6) of 670 degrees Celsius or more is provided in the growth furnace 10a. In the growth interruption, arsenic source material is supplied to the growth furnace 10a without supplying the group III metalorganic source material to the growth furnace 10a to form an arsenic atmosphere.

Atmospheric gas: arsine of a group V source material.
Temperature change rate: 10 to 30 degrees/min.
Time for growth interruption: 3 to 20 min The indium deposit PIN deposited on the chamber wall of the growth furnace 10a is deposited on the surface of the intermediate laminate 57 during the growth interruption, so that indium is incorporated into the surface of the III-V compound semiconductor (specifically, the surface of the undoped AlGaAs). Depending on the amount of In incorporated, carbon dopants supplied in subsequent growth will prevent the intermediate laminate 57 from diffusing and reaching the active layer. As will be understood from the results of Examples 1 to 3, improvement of the emission intensity is also affected in In composition of about 0.01%.

After the growth of the semiconductor is interrupted, a carbon dopant, a group III source material and a group V source material are supplied to the growth furnace 10*a* to grow the second semiconductor. Growing the second semiconductor comprises forming an upper semiconductor laminate on the substrate 51.

Figure 5A:
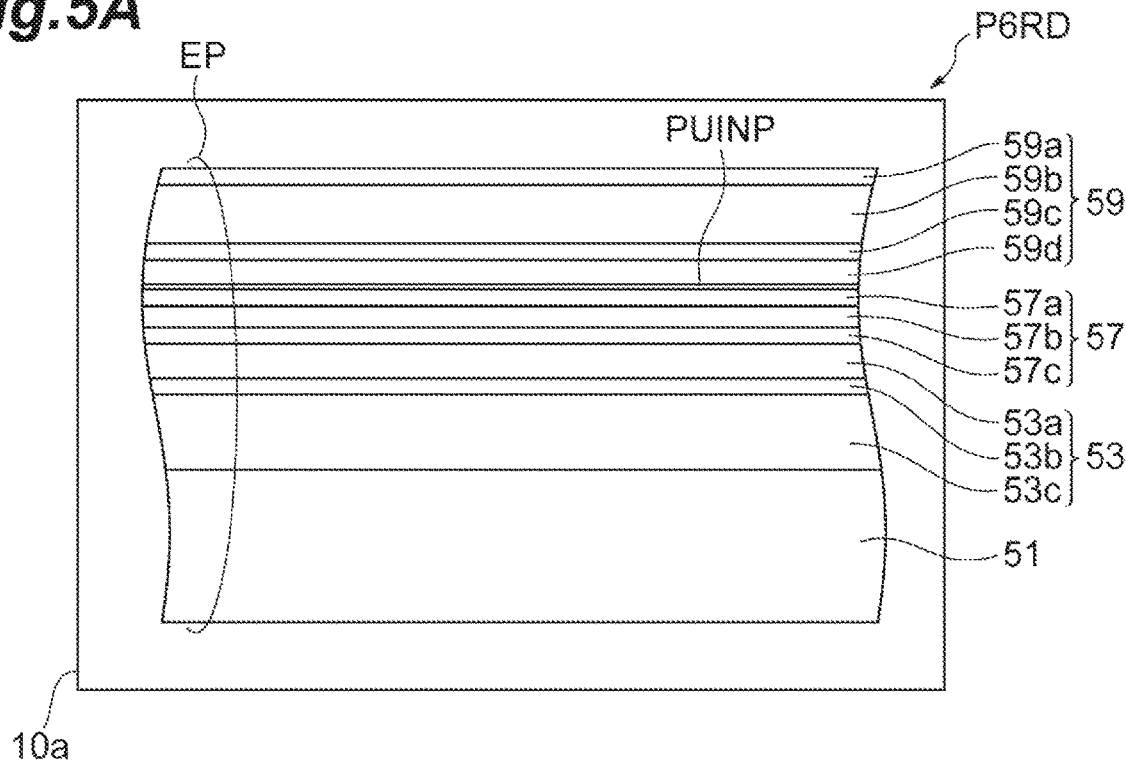
FIG. 5A is a view schematically showing a main step in a method for manufacturing a vertical cavity surface emitting laser according to the present embodiment.

Specifically, after reaching the target temperature due to the increase in the substrate temperature, as shown in FIG. 5A, during a period of the growth P6RD of the upper laminate (the first upper laminate 27, the current confinement structure 25, the second upper laminate 29, and the upper contact layer 31) on a base containing Indium deposited material (PUINP), for example on AlGaInAs containing a small amount of indium, gas is switched to start a supply of a deposition gas containing metalorganic source materials to the growth furnace 10*a* at the time t5 to grow the upper laminate 59 and stop the deposition in the growth furnace 10*a* at the time t6 at which the upper laminate 59 can be completed. The upper laminate 59 includes semiconductor layers (59*a*, 59*b*, 59*c*, 59*d*) for the upper contact layer 31, the first upper laminate 27, the current confinement structure 25, and the second upper laminate 29. In the present example, the upper laminate 59 includes, for example, a GaAs layer and/or a semiconductor layer of AlGaAs. The semiconductor layer 59*b* is made of a III-V compound semiconductor containing a high aluminum composition.

Example of Growth Conditions.
Substrate temperature for semiconductor crystal growth: 670 to 750 degrees Celsius.
Source materials used for growth: TMAl, TMGa, AsH$_3$, and CBr$_4$ of a carbon dopant gas.
Supply ratio between the group V source material and the group III source material: V/III ratio=100 to 160.
Growth rate: 0.4 to 0.7 nm/sec.
In accordance with this, an upper laminate 59 including a semiconductor layer for an upper distributed Bragg reflector is grown on the intermediate laminate 57.

By these steps, the epitaxial substrate EP is completed.

As will be understood from the description of the manufacturing method, the first semiconductor and the second semiconductor are grown at the first substrate temperature and the second substrate temperature, respectively. The second substrate temperature is higher than the first substrate temperature. The growth interruption of the semiconductor is performed during the change from one of the first substrate temperature and the second substrate temperature to the other.

According to the method for manufacturing a vertical cavity surface emitting laser, the method makes the first compound semiconductor layer containing indium from the group III source material of the source gas (group III source material and group V source material) supplied to the growth furnace 10*a* as a group III element grow on the substrate. The growth of the semiconductor is interrupted with supplying the group V source material to the growth furnace and without supplying the group III source material to the growth furnace. Due to the growth interruption, the semiconductor surface is modified. An upper semiconductor laminate is formed on a surface modified in a growth furnace. During the modification, indium atoms are deposited to form an indium layer on a part or the whole of the underlying semiconductor surface.

According to the method for manufacturing a vertical cavity surface emitting laser, the method can form a pile-up layer (PUINP) of indium on a semiconductor surface at the time of modification during growth interruption. The pile-up layer (PUINP) can reduce the diffusion of the carbon supplied in the subsequent growth. The intermediate laminate 57 including the semiconductor layer for the active layer has a carbon concentration of $2 \times 10^{16}$ cm$^{-3}$ or less.

Figure 5B:
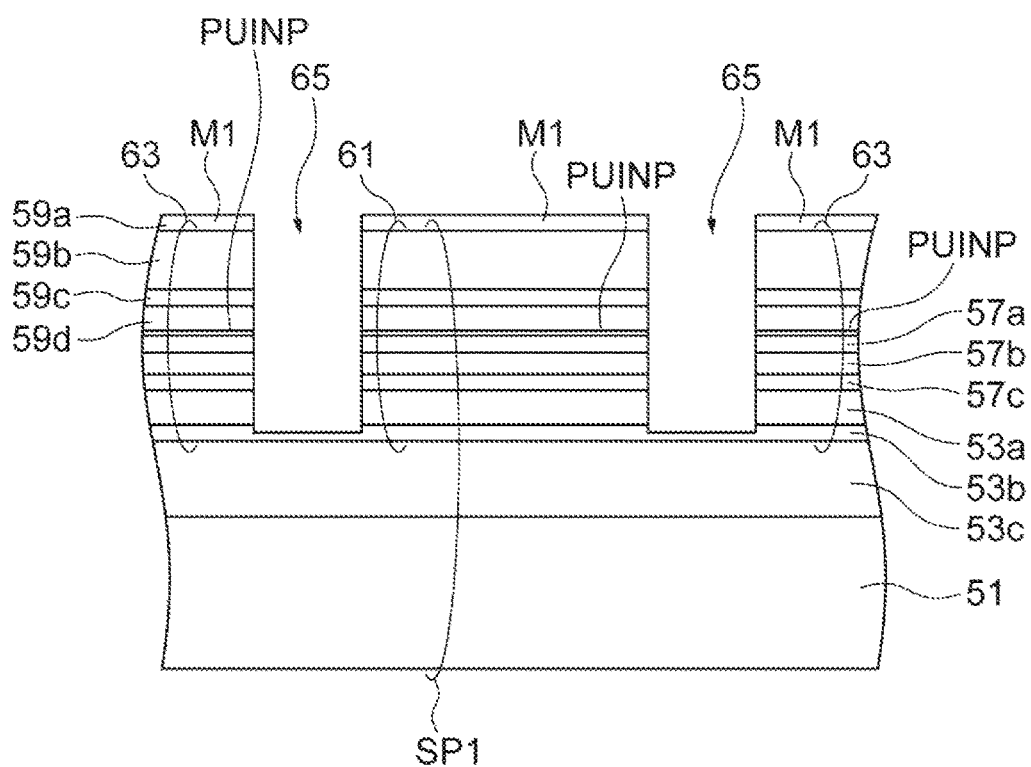
FIG. 5B is a view schematically showing a main step in a method for manufacturing a vertical cavity surface emitting laser according to the present embodiment.

As shown in FIG. 5B, a mask M1 defining the shape of the post is formed on the main surface of the epitaxial substrate EP. The epitaxial substrate EP is etched using the mask M1. The etching includes, for example, dry etching. A first substrate product SP1 includes a semiconductor post 61, a semiconductor terrace 63, and a groove 65 that separates the semiconductor post 61 from the semiconductor terrace 63. The semiconductor post 61 has a bottom located in a semiconductor layer (53*b*) for the lower contact layer 39. After etching, the mask M1 is removed to obtain a first substrate product SP1.

Figure 6A:
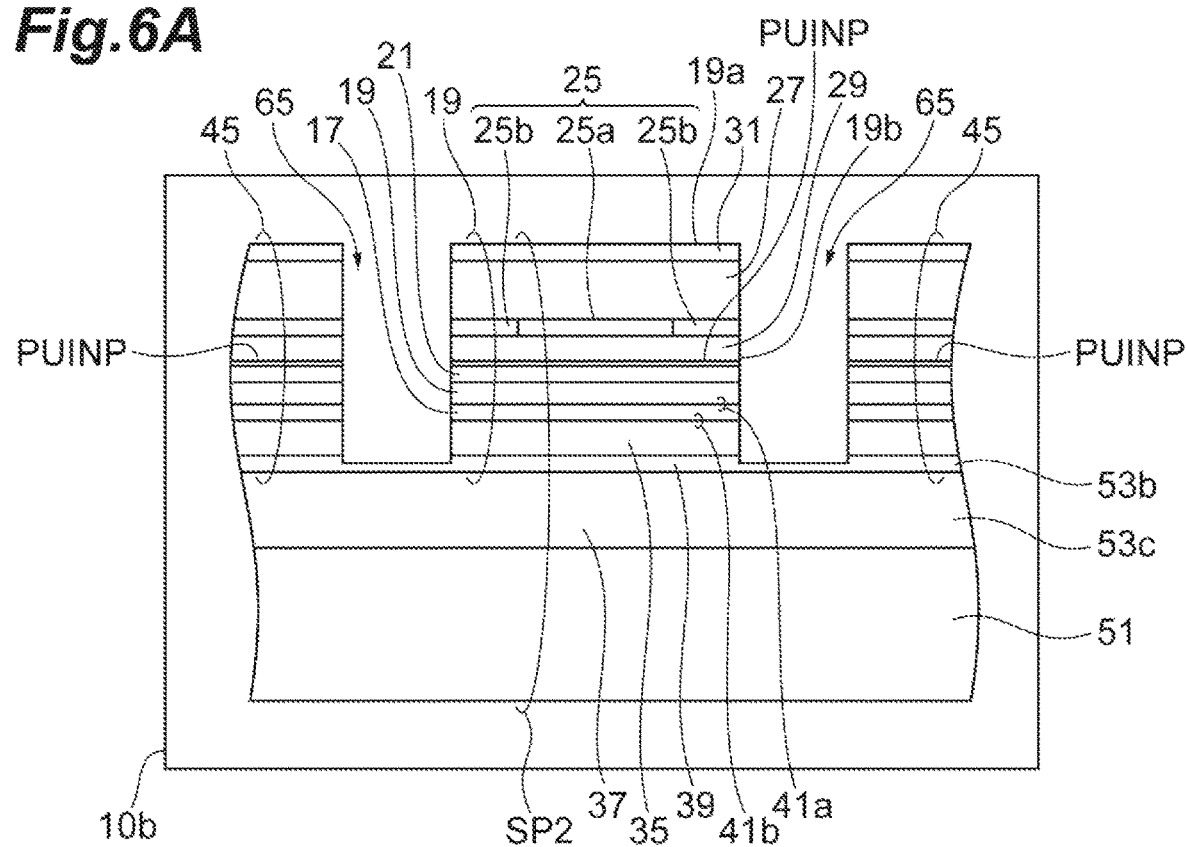
FIG. 6A is a view schematically showing a main step in a method for manufacturing a vertical cavity surface emitting laser according to the present embodiment.

As shown in FIG. 6A, the first substrate product SP1 is disposed in the oxidation furnace 10*b*. The first substrate product SP1 is exposed to an oxidizing atmosphere (for example, 350 degrees Celsius water vapor) to form the current confinement structure 25 from a semiconductor layer 59*c* of the III-V compound semiconductor containing the high aluminum composition in the first substrate product SP1. By the treatment in the oxidation furnace 10*b*, a second substrate product SP2 is obtained from the first substrate product SP1.

Figure 6B:
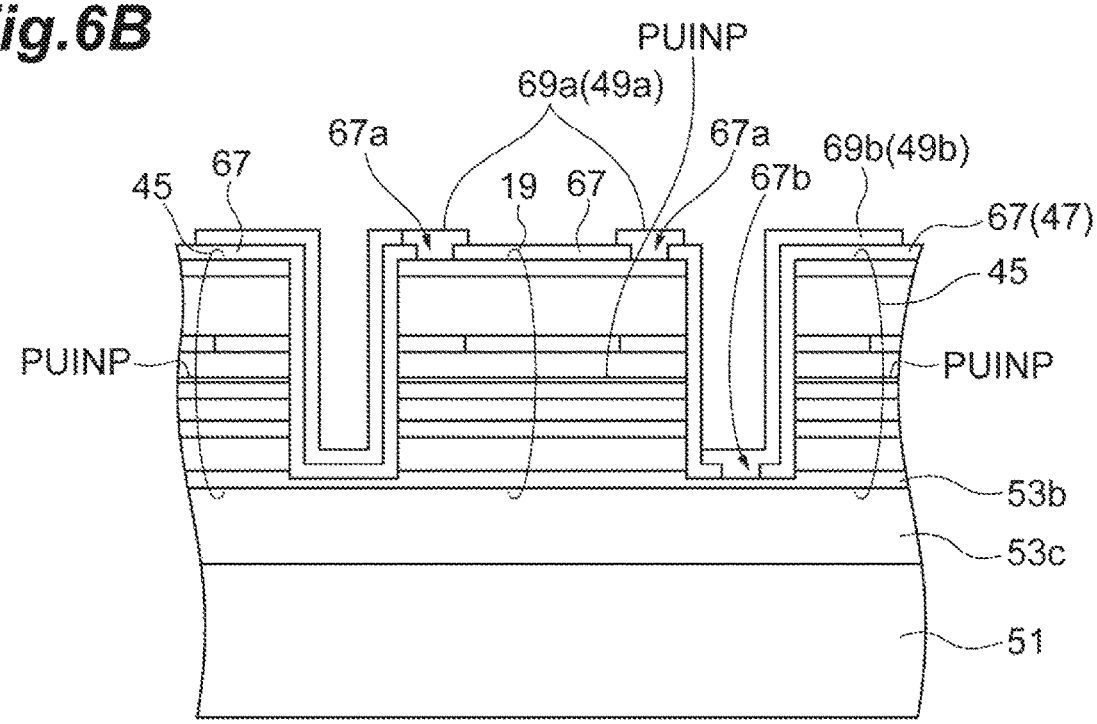
FIG. 6B is a view schematically showing a main step in a method for manufacturing a vertical cavity surface emitting laser according to the present embodiment.

As shown in FIG. 6B, a protective film 67 having a first opening 67*a* and a second opening 67*b* is formed on the second substrate product SP2, and a first electrode 69*a* and a second electrode 69*b* are formed on the protective film.

By these steps, a vertical cavity surface emitting laser 11 is provided.

Three examples will now be described.

EXAMPLE 1

Figure 7B:
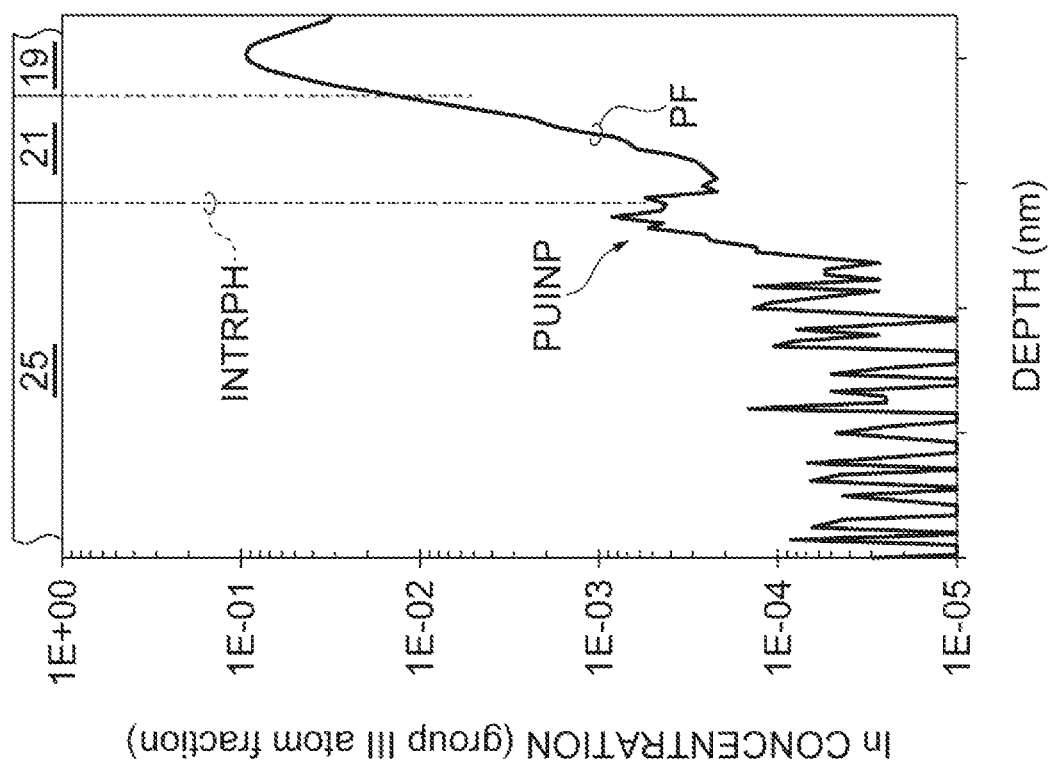
FIG. 7B is a diagram showing a SIMS profile of indium in an epitaxial structure of the vertical cavity surface emitting laser according to an example.
Figure 7A:
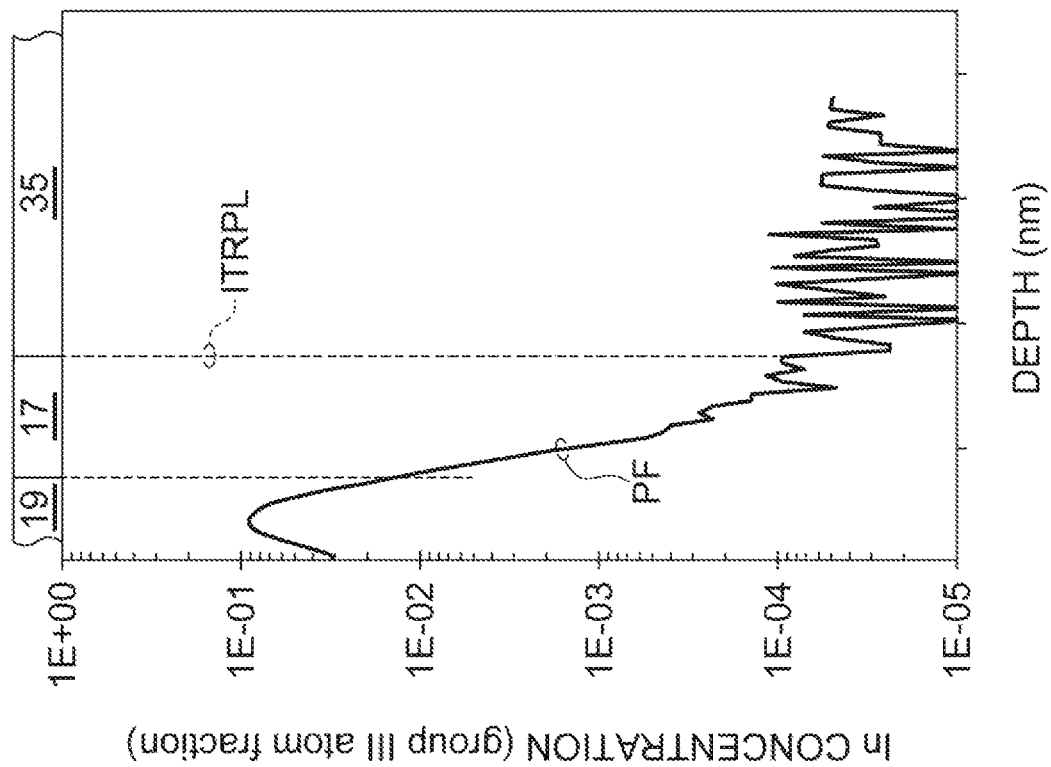
FIG. 7A is a diagram showing a SIMS profile of indium in an epitaxial structure of the vertical cavity surface emitting laser according to an example.

FIGS. 7A and 7B show the SIMS profile PF of indium in the epitaxial structure of the vertical cavity surface emitting laser according to Example 1. For ease of understanding, FIGS. 7A and 7B are given the reference numerals shown in FIG. 1, and the epitaxial structure is associated with the vertical cavity surface emitting laser 11.

Referring to FIG. 7A, the indium composition in the epitaxial range from the lower spacer layer of the lower laminate to the first well layer of the active layer is shown. The broken line ITR1PT shows the growth interruption in epitaxial growth in the epitaxial structure. In the present example, the substrate temperature is decreased at the time of the growth interruption.

Referring to FIG. 7B, the indium composition in the epitaxial range from the final well layer of the active layer to the upper spacer layer of the upper laminate is shown. The broken line ITR2PT shows the growth interruption in epitaxial growth in the epitaxial structure. In the present example, the substrate temperature is increased at the time of the growth interruption. The lower laminate and upper laminate are grown at 720 degrees Celsius. The lower spacer layer 17, the upper spacer layer 21 and the active layer 19 are grown at 620 degrees Celsius. The period of the growth interruption indicated by the broken line ITR1PT and the broken line ITR2PT is 15 minutes.

When both SIMS profiles PF are compared, a pile-up layer (PUINP) of indium is formed in the growth interruption after the growth of the active layer 19. From the experiments and other experiments according to this example, the peak indium composition of the pile-up layer (PUINP) of indium is greater than or equal to 0.01%.

The vertical cavity surface emitting semiconductor laser includes a GaAs substrate, a lower distributed Bragg reflecting portion provided on the GaAs substrate, and an upper distributed Bragg reflecting portion provided on the lower distributed Bragg reflecting portion. An active layer is provided between the lower distributed Bragg reflecting portion and the upper distributed Bragg reflecting portion. The lower distributed Bragg reflecting portion consists of a first lower distributed Bragg reflection and a second lower distributed Bragg reflection, and a lower contact layer made of AlGaAs is provided between the first lower distributed Bragg reflection and the second lower distributed Bragg reflection. An upper contact layer made of AlGaAs is provided on the upper distributed Bragg reflecting portion.

A first spacer layer made of AlGaAs is provided between the active layer and the lower distributed Bragg reflecting portion, and a second spacer layer made of AlGaAs is provided between the active layer and the upper distributed Bragg reflecting portion.

A current confinement layer for confining a current is provided in the upper distributed Bragg reflecting portion. The current confinement layer includes a semiconductor portion for allowing a current to pass therethrough and an annular insulator portion surrounding the semiconductor portion. The semiconductor portion is made of, for example, p-type AlGaAs, and the semiconductor part is made of, for example, an oxide of p-type AlGaAs.

In the lower distributed Bragg reflecting portion, 25 layers of Si-doped first n-type $Al_xGa_{1-x}As(0.8<X\leq1)$ layers and second n-type $Al_yGa_{1-y}As(0.1\leq Y<0.3)$ layers are alternately laminated. For the growth of the first and second AlGaAs, TMAl, TMGa and AsH$_3$ are used, and it is preferable to grow at a growth temperature of 670 to 720 degrees Celsius. When Si is doped as an n-type dopant in the lower distributed Bragg reflecting portion, it is preferable to use silane (SiH$_4$) as the source gas.

The thickness of the first and second spacer layers may be 5 to 25 nm. The Al composition of the spacer layer is 10% to 40%. Growth of the first and second spacer layers is carried out using TMAl, TMGa and AsH$_3$ at a growth temperature of 570 to 620 degrees Celsius.

The active layer has a multiquantum well structure. The active layer may have a quantum well structure MQW composed of an AlGaInAs quantum well layer and an AlGaAs barrier layer. The Al composition of the AlGaInAs quantum well layer may be 1 to 8%. The In composition may be 8 to 18%. The film thickness may be 2 to 7 nm. The Al composition of the AlGaAs barrier layer is 10 to 40%. The thickness thereof is 5 to 9 nm. For the growth of the active layer, TMAl, TMGa, TMIn and AsH$_3$ are used, and it is preferable to grow at a growth temperature of 570 to 620 degrees Celsius.

The upper distributed Bragg reflecting portion includes 25 layers of C-doped first p-type AlGaAs layers and C-doped second p-type AlGaAs layers. The first p-type AlGaAs layers and the second p-type AlGaAs layers are alternately laminated. For the growth of the first and second AlGaAs, TMAl, TMGa and AsH$_3$ are used, and it is preferable to grow at a growth temperature of 670 to 720 degrees Celsius. The carbon tetrabromide (CBr$_4$) is used for the addition of carbon (C) of the p-type dopant of the upper distributed Bragg reflecting portion.

Growth interruption is performed between the lower distributed Bragg reflecting portion and the first spacer layer and between the second spacer layer and the upper distributed Bragg reflecting portion. The substrate temperature is increased and decreased. During the growth interruption, the supply of the group III source material is stopped, and AsH$_3$ of the group V source material is supplied without the group III source material.

In Example 1, the distributed Bragg reflecting portion is grown at a growth temperature of 720 degrees Celsius. The active layer is grown at a growth temperature of 620 degrees Celsius. During these growth, a growth interruption of 15 minutes is performed. In the growth interruption, the substrate temperature is changed with an inclination. The SIMS analysis results in the vicinity of the active layer are referred to as In deposited material having a peak concentration of 0.09% at an interrupted interface of an upper portion between the second spacer layer and the upper distributed Bragg reflecting portion, here, for example, "pile-up layer (PUINP)" according to the shape of the profile. However, the In profile shows a monotonic change in the lower interrupted interface between the lower distributed Bragg reflecting portion and the first spacer layer. The upper In pile-up layer (PUINP) on the upper side is formed as follows. The In atom or indium source material supplied during the growth of the active layer is deposited on, for example, the chamber wall of the growth furnace, and reaches the semiconductor surface from the chamber wall during the growth interruption after the supply stop, thereby becoming a pile-up layer (PUINP).

EXAMPLE 2

In regard to the epitaxial growth conditions for the first growth temperature, the second growth temperature of the upper laminate, and the time for the growth interruption in the crystal growth of the active layer and the upper spacer layer, four kinds of device structures D1 to D4 each having a different growth interruption time are manufactured. For example, the display of "3E+16" indicates $3\times10^{+16}$.

Structure: a first growth temperature, a second growth temperature, a growth interruption, a peak In composition, and a carbon concentration.

D1: 620 degrees Celsius, 720 degrees Celsius, 0 minutes, less than 0.01%, 3E+16.

D2: 620 degrees Celsius, 720 degrees Celsius, 3 minutes, approximately 0.01%, 2E+16.

D3: 620 degrees Celsius, 720 degrees Celsius, 9 minutes, 0.03%, 1E+16.

D4: 620 degrees Celsius, 720 degrees Celsius, 15 minutes, 0.09%, 1E+16.

In Example 2, in the device structure prepared by changing the four kinds of interruption times, the In concentration at the interface between the upper spacer layer and the upper laminate and the carbon concentration of the active layer are measured. The carbon concentration in the active layer is decreased by an interruption time of three minutes or more, and a deposition layer of 0.01% or more of In is formed. Further, a deposition layer of 0.03% or more In is formed by an interruption time of nine minutes or more. Further, a deposition layer of 0.09% or more In is formed by an interruption time of 15 minutes or more. The carbon concentration of the active layer is 1E+16 cm$^{-3}$ or less. The carbon concentration is lower than the lower limit of carbon detection by the SIMS method.

EXAMPLE 3

In regard to the epitaxial growth conditions for the first growth temperature, the second growth temperature of the upper laminate, and the time for the growth interruption in the crystal growth of the active layer and the upper spacer layer, three kinds of device structures D5 to D7 each having a different second growth temperatures are manufactured.

Structure: a first growth temperature, a second growth temperature, a growth interruption, a peak In composition, and a carbon concentration.

D5: 620 degrees Celsius, 670 degrees Celsius, 15 minutes, 0.10%, less than 1E+16.

D6: 620 degrees Celsius, 720 degrees Celsius, 15 minutes, 0.09%, less than 1E+16.

D7: 620 degrees Celsius, 770 degrees Celsius, 15 minutes, less than 0.01%, 5E+16.

In Example 3, in the device structure prepared by changing the three kinds of the second growth temperatures, the In concentration at the interface between the upper spacer layer and the upper laminate and the carbon concentration of the active layer are measured. The carbon concentration in the active layer is decreased by a second growth temperature of 670 degrees Celsius or above and less than 770 degrees Celsius, and a deposition layer of 0.09% or more of In is formed. Further, a deposition layer of 0.09 to 0.10% of In is formed by a second growth temperature of 670 degrees Celsius or above and 720 degrees Celsius or less. The carbon concentration of the active layer is 1E+16 cm$^{-3}$ or less. The carbon concentration is lower than the lower limit of carbon detection by the SIMS method.

In these examples, according to the measurement of the emission intensity in the device structure, the low carbon concentration of the active layer can provide desirable light emission characteristics in the device structure D2 to D6. These device structures exhibit superior light emission characteristics as compared with the device structures D1 and D7. The light emission characteristics of the device structure D3 to D6 show superior emission characteristics to that of the device structure D2.

In Example 3, in the device structure in which the growth temperatures of the upper laminate (distributed Bragg reflection) is changed, the In concentration at the interface between the upper spacer layer and the upper laminate and the carbon concentration of the active layer are measured. When the growth temperature of the distributed Bragg reflection is 720 degrees Celsius or less, an In pile-up layer appearing in the SIMS profile is formed. The carbon concentration of the active layer is 1E+16 cm$^{-3}$ or less. The carbon concentration is lower than the lower limit of carbon detection by the SIMS method.

According to experiments and other experiments in these Examples, the vertical cavity surface emitting laser exhibits an improvement of emission intensity at the growth temperature of the active layer and upper spacer layer in the range of 570 to 620 degrees Celsius, the growth temperature of the carbon doped upper laminate in the range of 670 degrees Celsius to 720 degrees Celsius, and the growth interruption time in the range of 3 to 15 minutes.

While the principles of the invention have been illustrated and described in a preferred embodiment, it will be appreciated by those skilled in the art that the invention may be varied in position and in detail without departing from such principles. The invention is not limited to the specific configuration disclosed in the present embodiment. Accordingly, it is intended to cover all modifications and variations falling within the spirit and scope of the appended claims and their spirit.

What is claimed is:

1. A vertical cavity surface emitting laser comprising:
   an active layer comprising a quantum well structure comprising one or more well layers including a III-V compound semiconductor containing indium as a group III constituent element;
   an upper laminated region containing a carbon dopant; and
   a substrate for mounting a post including the active layer and the upper laminated region, wherein
   the active layer is provided between the upper laminated region and the substrate,
   the quantum well structure has a carbon concentration of $2 \times 10^{16}$ cm$^{-3}$ or less, and
   the upper laminated region includes a pile-up layer of indium at a position away from the active layer.

2. The vertical cavity surface emitting laser according to claim 1, further comprising a lower laminated region provided on the substrate, wherein
   the lower laminated region includes a lower laminate for a distributed Bragg reflector and a lower spacer layer provided between the lower laminate and the active layer,
   the lower laminated region includes a III-V compound semiconductor containing at least one of aluminum and gallium but not containing indium as a group III element, and
   the upper laminated region includes an upper laminate for a distributed Bragg reflector and an upper spacer layer provided between the upper laminate and the active layer.

3. The vertical cavity surface emitting laser according to claim 1, wherein the quantum well structure includes an AlGaInAs well layer and an AlGaAs barrier layer.

4. A method for manufacturing a vertical cavity surface emitting laser, comprising:
   disposing a substrate including a III-V compound semiconductor containing Ga and As as constituent elements in a growth furnace;
   growing a first semiconductor by supplying a group III source material and a group V source material to the growth furnace;
   interrupting a growth of a semiconductor without supplying the group III source material to the growth furnace after growing the first semiconductor; and
   growing a second semiconductor by supplying a carbon dopant, a group III source material and a group V source material to the growth furnace after interrupting the growth of the semiconductor,
   wherein
   growing the first semiconductor comprises growing an active layer having a first compound semiconductor layer containing indium from the group III source material as a group III element on the substrate, and
   growing the second semiconductor comprises forming an upper semiconductor laminate having a second compound semiconductor layer containing the carbon dopant on the substrate.

5. The method for manufacturing the vertical cavity surface emitting laser according to claim 4, wherein
   the first semiconductor is grown at a first substrate temperature,
   the second semiconductor is grown at a second substrate temperature,
   the second substrate temperature is higher than the first substrate temperature, and interrupting the growth of the semiconductor comprises changing a temperature from the first substrate temperature to the second substrate temperature.

6. The method for manufacturing the vertical cavity surface emitting laser according to claim 4, wherein the active layer has a carbon concentration of $2\times10^{16}$ cm$^{-3}$ or less.

\* \* \* \* \*